US009383805B2

(12) United States Patent
Jouin et al.

(10) Patent No.: US 9,383,805 B2
(45) Date of Patent: Jul. 5, 2016

(54) GENERATING CLOCK ON DEMAND

(71) Applicant: Atmel Corporation, San Jose, CA (US)

(72) Inventors: Sebastien Jouin, La Chapelle-Launay (FR); Patrice Menard, Saint-Mars-du-Desert (FR); Thierry Gourbilleau, Le Loroux-Bottereau (FR); Yann Le Floch, Nante (FR); Mohamed Aichouchi, Nantes (FR)

(73) Assignee: Atmel Corporation, San Jose, CA (US)

( * ) Notice: Subject to any disclaimer, the term of this patent is extended or adjusted under 35 U.S.C. 154(b) by 269 days.

(21) Appl. No.: 13/797,538

(22) Filed: Mar. 12, 2013

(65) Prior Publication Data

US 2014/0266333 A1  Sep. 18, 2014

(51) Int. Cl.
*G06F 1/32* (2006.01)
*H03K 19/00* (2006.01)
*G06F 1/10* (2006.01)

(52) U.S. Cl.
CPC ............... *G06F 1/3237* (2013.01); *G06F 1/10* (2013.01); *H03K 19/0016* (2013.01); *G06F 2217/62* (2013.01); *Y02B 60/1221* (2013.01)

(58) Field of Classification Search
CPC .......... G06F 1/00; G06F 1/3237; H03K 19/00

USPC .................................................. 713/500, 600
See application file for complete search history.

(56) References Cited

U.S. PATENT DOCUMENTS

| 5,677,849 | A | 10/1997 | Smith | |
|---|---|---|---|---|
| 5,903,746 | A | * 5/1999 | Swoboda et al. | ............. 713/501 |
| 6,014,751 | A | 1/2000 | Kardach | |
| 6,157,265 | A | * 12/2000 | Hanjani | .......................... 331/49 |
| 6,728,892 | B1 | 4/2004 | Silvkoff | |
| 6,986,074 | B2 | 1/2006 | Alia | |
| 8,086,885 | B2 | * 12/2011 | Vaajala | ......................... 713/322 |
| 8,448,002 | B2 | 5/2013 | Bulusu | |
| 8,466,723 | B2 | * 6/2013 | Klapproth et al. | ............ 327/144 |
| 2003/0024984 | A1 | * 2/2003 | Yamasaki | ...................... 235/451 |
| 2005/0232218 | A1 | * 10/2005 | Edwards et al. | ............. 370/347 |
| 2011/0026656 | A1 | * 2/2011 | Gregie et al. | ................. 375/371 |
| 2013/0055004 | A1 | * 2/2013 | Koniaris et al. | ............... 713/501 |
| 2013/0173951 | A1 | * 7/2013 | Vogel | ............................ 713/600 |
| 2015/0067363 | A1 | 3/2015 | Jouin et al. | |

* cited by examiner

*Primary Examiner* — Vincent Tran
(74) *Attorney, Agent, or Firm* — Fish & Richardson P.C.

(57) ABSTRACT

A clock generation system for an integrated circuit (IC) chip (e.g., a microcontroller) is disclosed that allows digital blocks and other components in the IC chip to start and stop internal clocks dynamically on demand to reduce power consumption.

20 Claims, 4 Drawing Sheets

GENERATING CLOCK ON DEMAND

TECHNICAL FIELD

This disclosure relates generally to clock generation circuits for low power integrated circuits (e.g., microcontrollers).

BACKGROUND

A clock generator circuit produces one or more clock signals (also referred to as "clocks") for use in synchronizing the operation of digital blocks. A clock signal can be, for example, a symmetrical square wave. A conventional clock generator includes a resonant circuit and an amplifier. The resonant circuit may be a quartz piezo-electric oscillator, a tank circuit or an Resistor-Capacitor (RC) circuit. The amplifier inverts the signal from the oscillator and feeds a portion back into the oscillator to maintain oscillation. The clock generator may include a frequency divider or clock multiplier, which can be programmed to allow a variety of output frequencies to be selected without modifying hardware.

In low power microcontrollers that use conventional clock generator circuits, a clock signal for a digital block may run continuously even if the clock signal is not needed by the digital block, resulting in wasted power.

SUMMARY

A clock generator circuit for an integrated circuit (IC) chip (e.g., a microcontroller) is disclosed that allows digital blocks in the IC chip to start and stop internal clocks dynamically on demand to reduce power consumption.

A method performed by a clock generator circuit includes receiving a clock consumer request from a clock consumer; selecting a clock source based on the clock consumer request; receiving a waveform from the clock source; generating a clock from the waveform; and routing the clock to the clock consumer. In some implementations, the method further includes determining that the clock consumer request has been released, and stopping the clock signal. In some implementations, the method further includes determining that no clock consumer is requesting the clock source, and releasing the clock source.

Other implementations are discloses that are directed to systems and/or devices.

Particular implementations of a clock generator circuit for a generating clock on demand provides one or more of the following advantages: digital blocks and other circuit components in an IC chip may start and stop internal clocks dynamically on demand to reduce power consumption.

DETAILED DESCRIPTION

Example Clock Generator System

Figure 1:
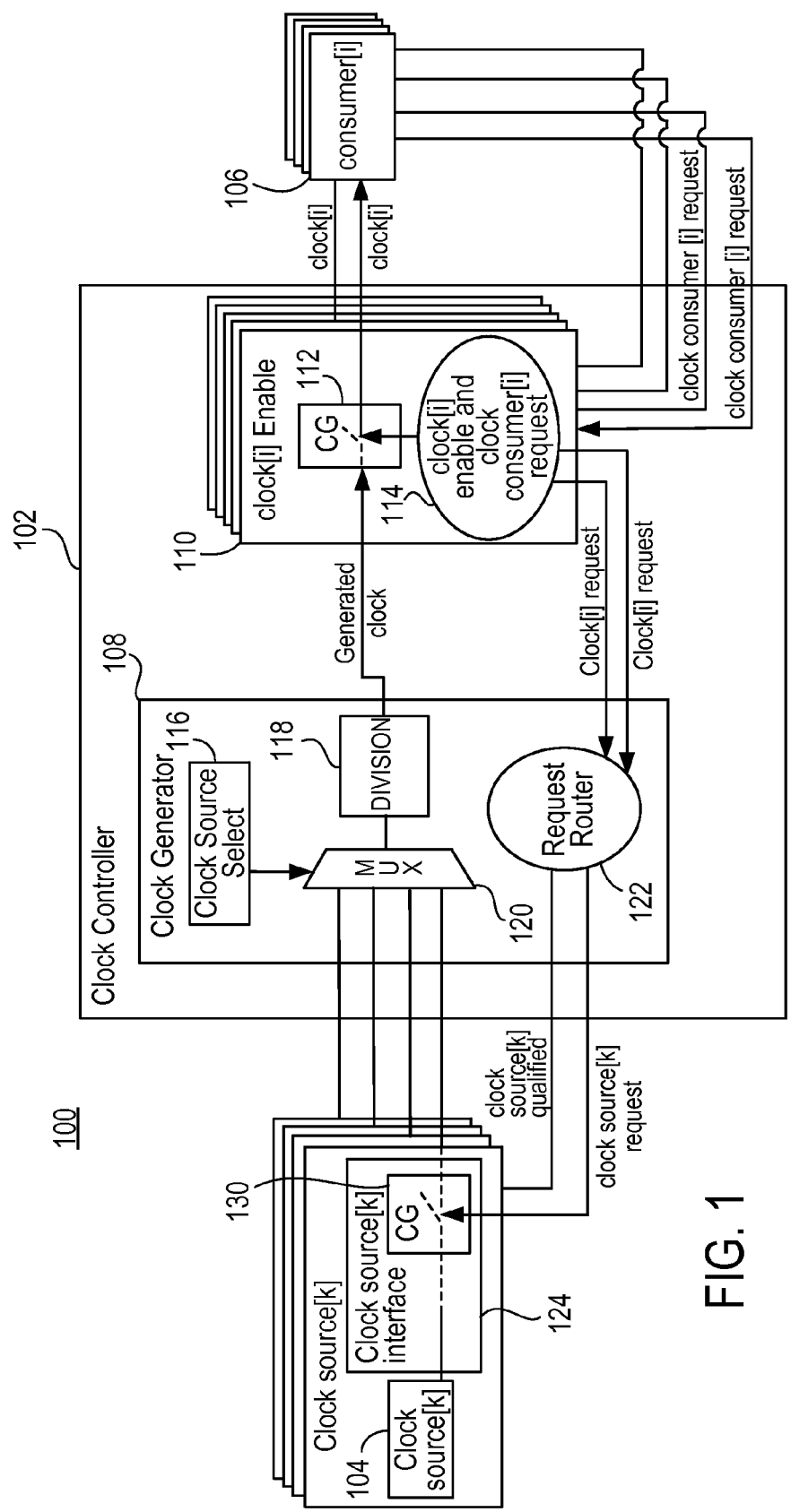
FIG. 1 is a block diagram of an example clock generator system capable of generating clocks on demand.

FIG. 1 is a block diagram of an example clock generator system 100 capable of generating a clock on demand. In some implementations, system 100 may include clock controller 102, clock source(s) 104, clock consumer(s) 106, clock generator 108, clock enable circuit(s) 110, clock gate 112, clock gate controller 114, clock source selector 116, clock divider 118, multiplexer 120 and request router 122. In the example shown, there are i clock consumers 106 and k clock source systems 104, as indicated by the subscripts i and k. System 100 can have any number of clock sources and clock consumers.

Clock consumer 106 (e.g., a digital block) sends a clock consumer request to clock controller 102 when a clock is needed by clock consumer 106 to carry out a task. The clock consumer request causes clock enable circuit 110 to route a clock signal generated by clock generator 108 to clock consumer 106. In some implementations, routing is achieved by clock gate controller 114 closing clock gate 112 in clock enable circuit 110, resulting in the clock signal being routed to clock consumer 106.

The clock consumer request is forwarded to request router 122 in clock generator 108, which in turn sends a clock source request to clock source interface 124. Clock source interface 124 uses the clock request to select a clock source from a plurality of clock sources 104, which has clock characteristics needed by clock consumer 106 (e.g., frequency, duty cycle, accuracy). In the example shown, the clock consumer request is used to close clock gate 130, allowing the selected clock source to provide a waveform to clock generator 108. The waveform (e.g., a symmetrical square wave with 50% duty cycle) is provided as input (perhaps with other waveforms) to multiplexer 120 in clock generator 108. Clock source selector 116 selects one of N waveforms provided by clock sources 104. The waveform generated by the selected clock source may be divided down by clock divider 118 or multiplied by a factor using a clock multiplier to generate a clock. The clock is sent to clock enable circuit 110. The selected clock source continues to run as long as at least one clock consumer is requesting the selected clock source. Having the selected clock source continuously run even if there is no demand from clock consumers will waste power. When there are no longer any clock consumers requesting the selected clock source, the request for the selected clock source is released and the selected clock source is stopped by, for example, opening clock gate 130. Depending on the application, the selected clock source may be switched off entirely (rather than gated) when the selected clock source is not requested by any clock consumers to reduce further power consumption.

Figure 2:
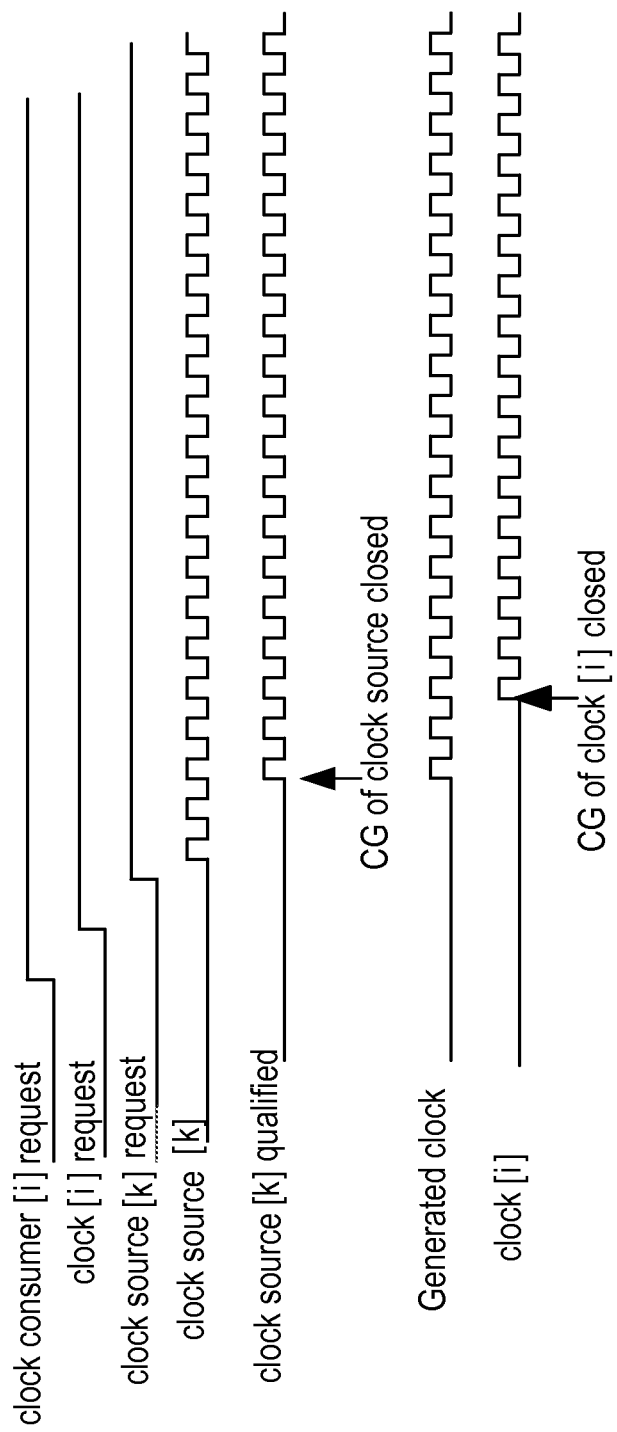
FIG. 2 is a timing diagram of an example clock request process.

FIG. 2 is a timing diagram of an example clock request process. When a clock consumer [i] request is received, a clock [i] request is sent to a request router. The request router generates a clock source [k] request, which is used to select a clock source [k] that can fulfill the clock source [k] request. Clock source [k] is started to provide a qualified clock source [k]. For example, a clock gate coupled in series with clock source [k] may be closed to start clock source [k]. Clock source [k] (e.g., a symmetrical square waveform) may be further processed (e.g., divided, multiplied) to generate a generated clock [i] that may be shared by different consumers [i] if there are less generated clocks than clocks for consumers. The generated clock [i] may be routed to the clock [i] of the consumer [i] (e.g., a digital block) by, for example, closing a clock gate coupled in series with the generated clock [i].

Figure 3:
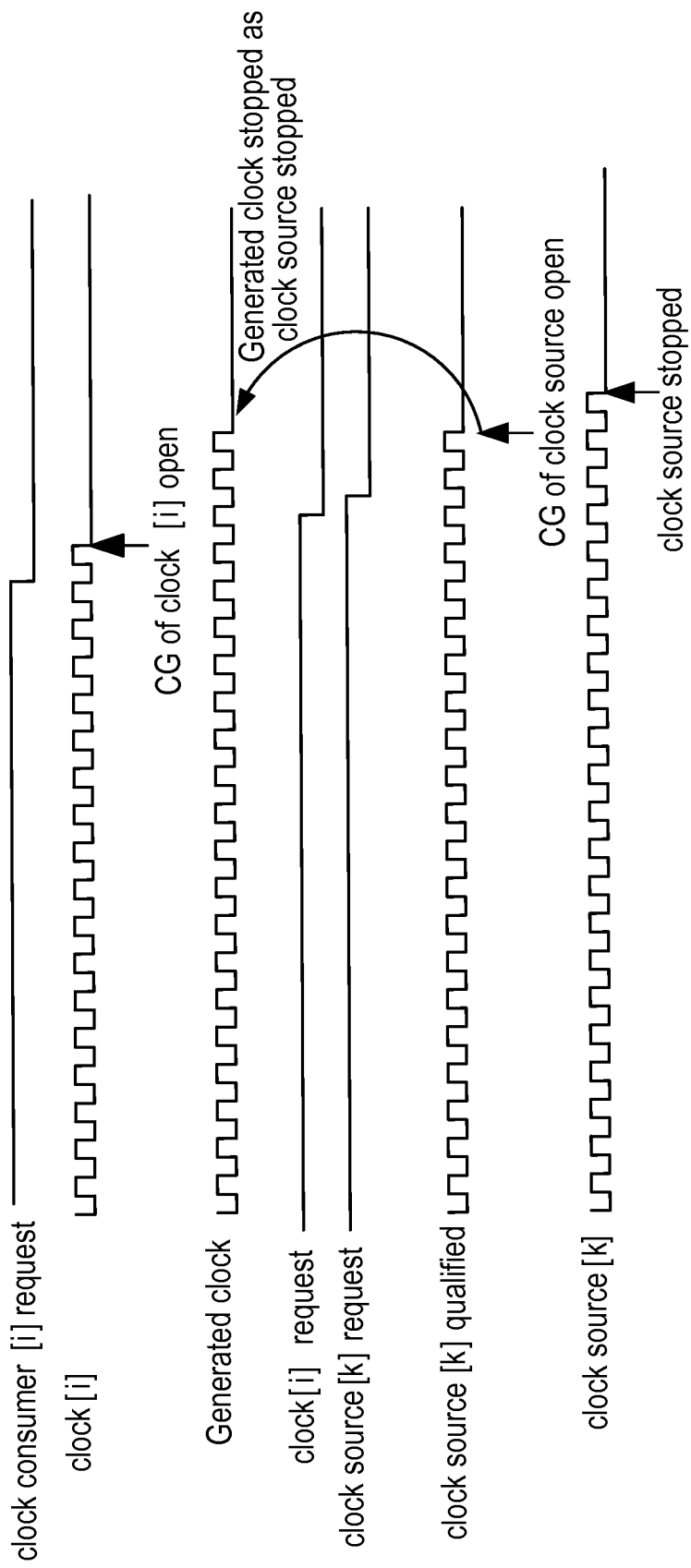
FIG. 3 is a timing diagram of an example clock release process.

FIG. 3 is a timing diagram of an example clock release process. A clock consumer [i] may release its respective clock [i] request at any time. The clock [i] is stopped by, for example, opening a clock gate coupled in series with the clock [i]. If no clock consumer requests the clock [i], which is generated by clock source [k], the clock source [k] request may be released. When the clock source [k] request is released, the clock source [k] is stopped by, for example, opening a clock gate coupled in series with the clock source [k]. This gating mechanism is performed in a dynamic manner, resulting in reduced power consumption. Moreover, depending on the application, the clock source [k] may be switched off entirely (rather than gated) when the clock source [k] is not requested by any clock consumers to reduce further power consumption.

Figure 4:
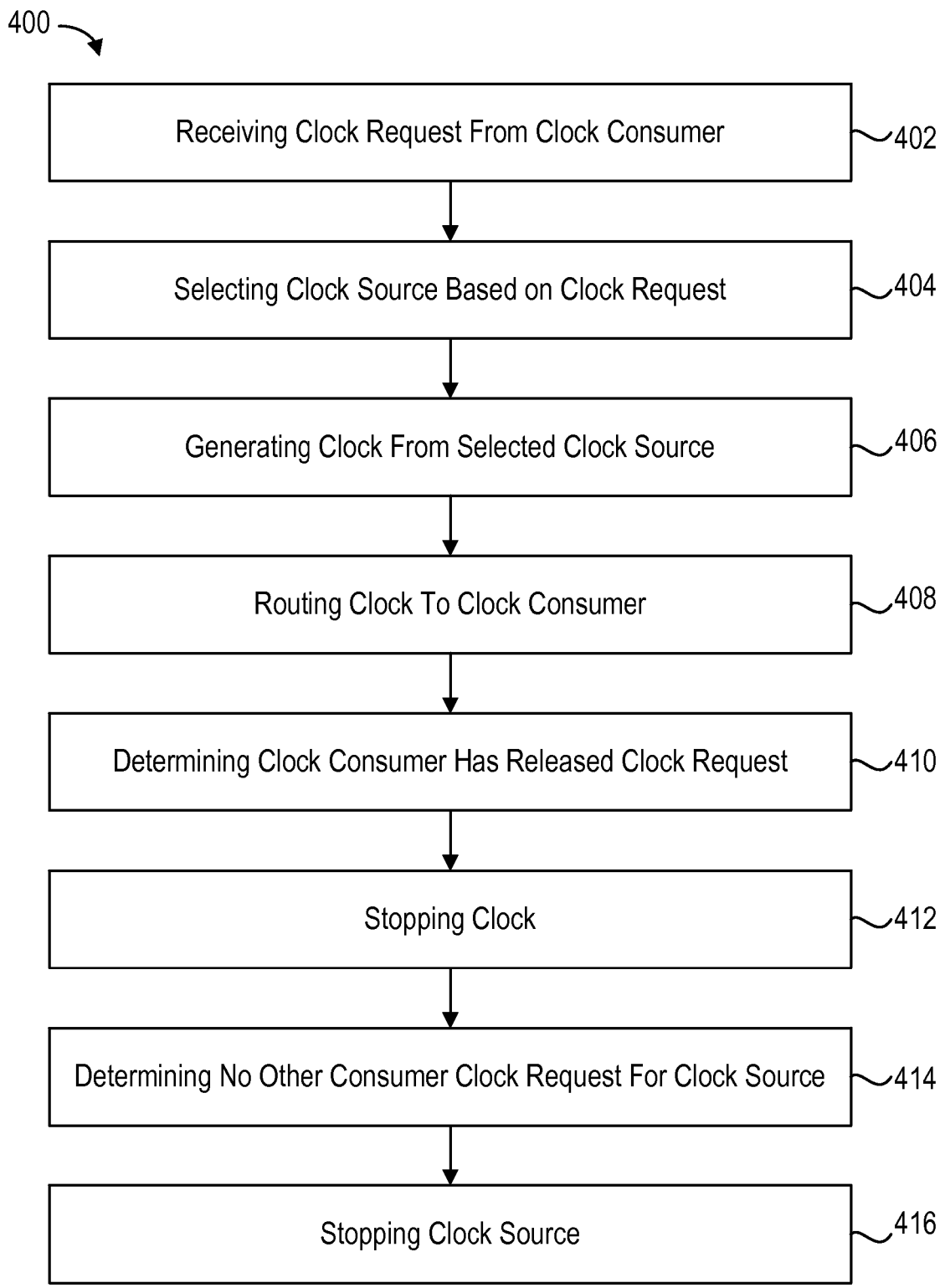
FIG. 4 illustrates a flow diagram of an example dynamic clock request and release process.

FIG. 4 illustrates a flow diagram of an example dynamic clock request and release process 400. Process 400 may be implemented by system 100 described with reference to FIG. 1.

In some implementations, process 400 may begin by receiving a clock request from a clock consumer (402). There may be more than one clock source and more than one clock consumer. A clock consumer may be any component, circuit, block or subsystem that uses a clock signal for its operation (e.g., a digital block).

Process 400 may continue by selecting a clock source based on the clock request (404). The selecting may include selecting a clock source with characteristics requested by the clock consumer (e.g., frequency, duty cycle, accuracy).

Process 400 may continue by generating a clock from the clock source (406) and routing the generated clock to the requesting clock consumer (408). A clock may be any desired waveform, such as a symmetrical square wave with a 50% duty cycle.

Process 400 may continue by determining that the clock consumer has released the clock request (410) and stopping the clock (412).

Process 400 may continue by determining that no other clock consumer is requesting the clock from the clock source (414) and stopping the clock source (416). The clock source may be released using a clock gate or turned off.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A method comprising:
   receiving a clock consumer request from a clock consumer;
   selecting a clock source from a plurality of clock sources based on a close of circuitry coupled in series with the clock source using the clock consumer request;
   receiving a waveform from the selected clock source;
   generating a clock from the waveform;
   routing the generated clock to the clock consumer;
   determining that the clock consumer request has been released by the clock consumer;
   determining that no clock consumer is requesting the selected clock source;
   in response to determining that the clock consumer request has been released by the clock consumer and determining that no clock consumer is requesting the selected clock source, releasing the selected clock source independent of the other clock sources of the plurality of clock sources; and
   in response to releasing the selected clock source, stopping the selected clock source.

2. The method of claim 1, wherein stopping the selected clock source comprises stopping the selected clock source based on an opening of the circuitry.

3. The method of claim 1, wherein stopping the selected clock source comprises switching off the selected clock source.

4. The method of claim 1, further comprising:
   routing the generated clock to a second, different clock consumer.

5. The method of claim 1, further comprising:
   in response to determining that the clock consumer request has been released, stopping the generated clock.

6. The method of claim 1, wherein routing the generated clock to the clock consumer comprises routing the generated clock to the clock consumer based on a close of second circuitry coupled in series with the generated clock, the second circuitry being different from the circuitry.

7. The method of claim 6, further comprising:
   in response to determining that the clock consumer request has been released, stopping the generated clock based on an opening of the second circuitry.

8. The method of claim 1, wherein the generated clock is stopped as a result of stopping the selected clock source.

9. A clock controller, comprising:
   a clock generator configured to select a clock source from a plurality of clock sources based on a close of circuitry coupled in series with the clock source using a clock consumer request from a clock consumer, receive a clock source waveform, and to generate a clock from the clock source waveform; and
   a clock enable circuit coupled to the clock generator and the clock consumer, the clock enable circuit configured to route the clock to the clock consumer, to stop the clock in response to a released clock consumer request and to stop the clock source independent of other clock sources of the plurality of clock sources, if no clock consumer is requesting the clock source and the clock consumer request has been released.

10. The clock controller of claim 9, where the clock generator further comprises:
    a request router configured for receiving clock consumer requests from clock consumers and for sending clock source requests to clock sources; and
    a multiplexer coupled to the clock sources and configurable for selecting a clock source.

11. The clock controller of claim 10, where the multiplexer is coupled to a clock source selector signal for selecting a clock source waveform.

12. The clock controller of claim 11, further comprising:
    a clock divider circuit configured for dividing the waveform.

13. The clock controller of claim 11, further comprising:
    a clock multiplier circuit configured for multiplying the waveform.

14. The clock controller of claim 9, where the clock controller is included in a microcontroller.

15. The clock controller of claim 9, wherein the clock enable circuit is configured to:
    stop the clock source based on an opening of the circuitry.

16. The clock controller of claim 9, wherein the clock enable circuit is configured to stop the selected clock source by switching off the selected clock source.

17. The clock controller of claim 9, wherein the clock enable circuit is configured to route the generated clock to a second, different clock consumer.

18. The clock controller of claim 9, wherein the clock enable circuit is configured to route the generated clock to the clock consumer based on a close of second circuitry coupled in series with the generated clock, the second circuitry being different from the circuitry.

19. The clock controller of claim 18, wherein the clock enable circuit is configured to stop the generated clock based on an opening of the second circuitry.

20. The clock controller of claim 9, wherein the generated clock is stopped as a result of stopping the selected clock source.

\* \* \* \* \*